United States Patent [19]

Arvanitis

[11] Patent Number: 4,642,505
[45] Date of Patent: Feb. 10, 1987

[54] LASER TRIMMING MONOLITHIC CRYSTAL FILTERS TO FREQUENCY

[75] Inventor: Aristotelis S. Arvanitis, Addison, Ill.

[73] Assignee: Motorola, Inc., Schaumburg, Ill.

[21] Appl. No.: 585,967

[22] Filed: Mar. 5, 1984

[51] Int. Cl.$^4$ ............................................. H01L 41/08
[52] U.S. Cl. ................................... 310/312; 310/320;
310/365; 310/366; 29/25.35
[58] Field of Search ............... 310/320, 312, 366, 365;
29/25.35; 219/121 LM; 51/319

[56] References Cited

U.S. PATENT DOCUMENTS

| | | | |
|---|---|---|---|
| 3,535,778 | 10/1970 | Falanga et al. | 29/610 |
| 3,683,213 | 8/1972 | Staudte | 310/9.6 |
| 3,766,616 | 10/1973 | Staudte | 29/25.35 |
| 3,781,577 | 12/1973 | Nonaka et al. | 310/312 X |
| 3,913,195 | 10/1975 | Beaver | 29/25.35 |
| 4,062,154 | 12/1977 | Huguenin et al. | 51/319 |
| 4,081,653 | 3/1978 | Koo et al. | 219/121 |
| 4,131,484 | 12/1978 | Caruso et al. | 134/1 |
| 4,169,976 | 10/1979 | Cirri | 219/121 |
| 4,179,310 | 12/1979 | Compton et al. | 148/1.5 |
| 4,184,062 | 1/1980 | Schmidt | 219/121 L |
| 4,211,947 | 7/1980 | Ikeno et al. | 310/312 |
| 4,218,631 | 8/1980 | Yamaguchi | 310/312 |
| 4,259,563 | 3/1981 | Madeley | 219/121 |
| 4,346,537 | 8/1982 | Masujima et al. | 51/413 |
| 4,379,244 | 4/1983 | Dinger | 310/312 |
| 4,418,299 | 11/1983 | Momosaki | 310/312 X |
| 4,447,753 | 5/1984 | Ochiai | 310/312 |
| 4,455,500 | 6/1984 | Savit et al. | 310/312 |
| 4,468,582 | 8/1984 | Fujiwara et al. | 310/312 |
| 4,562,370 | 12/1985 | Dach | 310/312 |

FOREIGN PATENT DOCUMENTS

| | | | |
|---|---|---|---|
| 2235495 | 1/1975 | Fed. Rep. of Germany | 310/312 |
| 0032651 | 3/1977 | Japan | 310/312 |

OTHER PUBLICATIONS

Hokanson, J. L., "Laser Machining Thin Film Electrode Arrays on Quartz Crystal Substrates," 23rd Annual Frequency Control Symposium, May 1969, pp. 163–170.

Hokanson, J. L. and Unger, B. A., "Laser-Machining Thin Film Electrode Arrays on Quartz Crystal Substrates," Journal of Applied Physics, vol. 40, No. 8, Jul. 1969, pp. 3157–3160.

Primary Examiner—Mark O. Budd
Attorney, Agent, or Firm—Douglas A. Boehm; Donald B. Southard

[57] ABSTRACT

An improved method of adjusting piezoelectric devices to frequency by particularized laser trimming is disclosed. The laser removes a single contiguous area in the center of the electrodes to appropriately increase the individual resonator frequency without significantly degrading the filter "Q". In an AT-cut monolithic crystal filter, the particularized laser trimmed area can be positioned such on the face of the electrodes to simultaneously control frequency and bandwidth. This method can be substituted for the more cumbersome process of frequency adjustment by vapor deposition to provide a rapid inexpensive technique for monolithic crystal filter manufacture.

52 Claims, 12 Drawing Figures

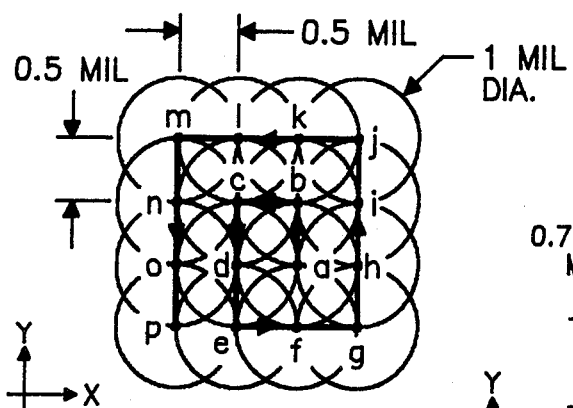
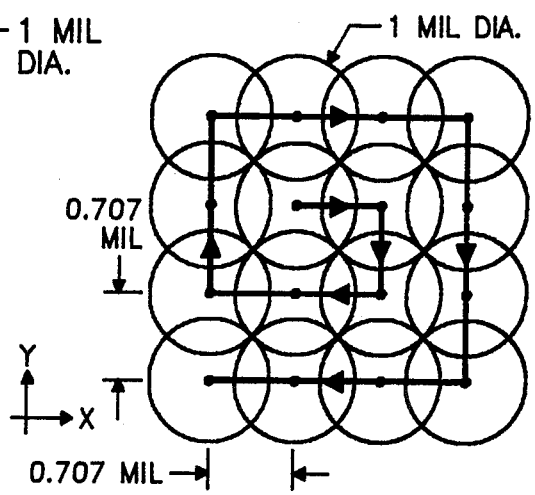
Fig. 4a
Fig. 4b
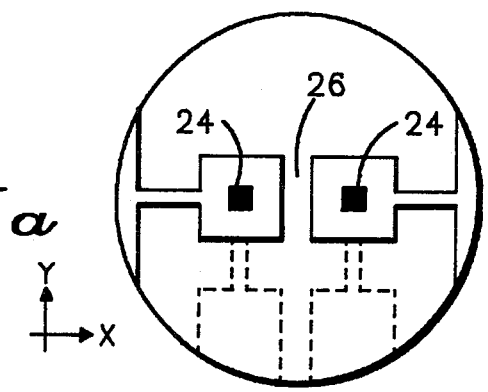
Fig. 5a
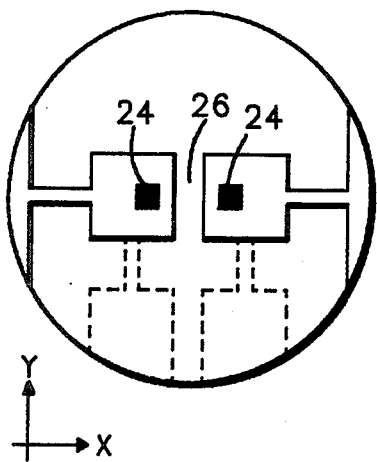
Fig. 5b
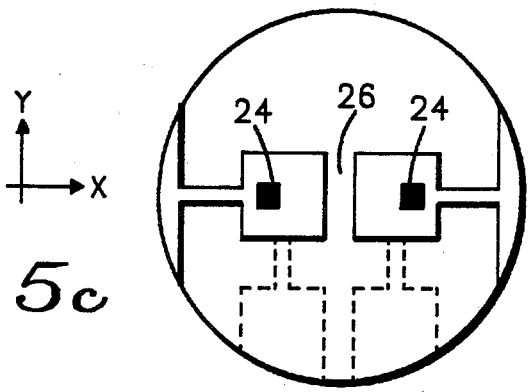
Fig. 5c

LASER TRIMMING MONOLITHIC CRYSTAL FILTERS TO FREQUENCY

FIELD OF INVENTION

The present invention relates to an improved method of adjusting piezoelectric devices to frequency by laser beam machining, particularly AT-cut quartz resonators as used in monolithic crystal filters.

DESCRIPTION OF PRIOR ART

Piezoelectric crystals, such as AT-cut quartz resonators, are well known and widely used in the art, and are particularly applicable for use in high frequency filters. One important concern in the crystal filter industry is the adjustment of crystal resonators to the desired operating frequency. Typically, this adjustment is accomplished by adding mass to the crystal electrode through the process of vacuum deposition. This time-consuming procedure involves the use of numerous masking steps which must be performed in a contamination-free vacuum deposition chamber under critical tolerance conditions. Monolithic crystal filters present further production masking problems since the electrode dimension and inter-resonator spacing must be accurately controlled to determine the acoustic coupling. Recently, the laser has been used as a tool for adjusting the frequency of piezoelectric resonators. J. L. Hokanson, in his article entitled "Laser Machining Thin Film Electrode Arrays on Quartz Crystal Substrates", published in the 23rd Annual Frequency Control Symposium, May 1969, pp. 163–170, teaches the method of laser trimming AT-cut quartz crystal electrode arrays for performing vernier adjustments to both frequency and bandwidth of monolithic crystal filters, thereby eliminating the above-mentioned masking steps. The frequency has been adjusted upward by vaporizing a regularly-spaced array of holes called "spot patterns" on the electrode surface, and the bandwidth has been adjusted downward by removing electrode material from the edge of one electrode and by removing bits of mass from a stripe of metal evaporated between adjacent resonators. This "spot pattern" technique for removing electrode material is not particularly suited for a large change in frequency on the order of kilohertz, since the laser beam affects the adhesion properties of the electrode material, creating a significant accumulation of loosely-adhering particles surrounding the spot removed. These particles change the electrical parameters of the piezoelectric device, more specifically, the "Q" of the filter is substantially degraded.

One proposed solution to this problem of "Q" degradation is disclosed by Caruso, et al., in U.S. Pat. No. 4,131,484, entitled "Frequency Adjusting a Piezoelectric Device by Lasering", which teaches the method of adjusting the resonator frequency of a piezoelectric crystal by laser machining the electrode while simultaneously overdriving the device at a high current level to prevent lasered particles from accumulating on the device. This practice of overdriving a piezoelectric resonator by operating at a high current level causes distortion of the frequency response of the device, which makes it difficult to retain control of the laser trimming process as the desired frequency is approached. Therefore, this technique requires the operator to sequentially reduce drive levels and decrease laser machining levels, which reduces the "electronic cleaning" action desired, to compensate for this distortion. Furthermore, it becomes increasingly difficult to maintain other electrical parameters, such as high filter "Q", when this technique is used to perform large adjustments to the resonant frequency, since the desired cleaning action is sequentially reduced allowing lasered particles to accumulate. Not only is the referenced cleaning process complicated, but it is to be noted that the "Q" of the crystal filter device is no way optimized since Caruso embodies the same "spot pattern" technique as taught by Hokanson.

The prior art technique of adjusting the bandwidth of monolithic crystal filters by removing portions of mass from the stripe of metal evaporated between the electrodes for this purpose, or by removing material from the edge of the electrode, has the inherent disadvantage that the inter-resonator coupling can only be decreased with laser trimming. Additionally, the crystal filter may exhibit a degradation in spurious response attributed to the trimming stripe located between the electrodes.

A need, therefore, exists for improvement of processes for laser trimming piezoelectric resonators to frequency for monolithic crystal filters. The present invention is specifically directed to this improvement.

Accordingly, it is an object of the present invention to provide a method for adjusting the frequency of piezoelectric resonators by laser trimming the electrodes in a particular manner to appropriately increase the frequency without significantly degrading the "Q" of the filter.

Another object of the present invention is to provide a method for adjusting the bandwidth of a monolithic crystal filter in both increasing or decreasing increments by laser trimming the electrodes.

A further object of the present invention is to provide an improved manufacturing process to control the resonator frequency difference of the monolithic crystal filter by particularized laser trimming of the electrodes.

Still another object of the present invention is to provide an improved monolithic crystal filter wherein the frequency and bandwidth have been adjusted by laser trimming the electrodes in a particular manner such that the degradation of "Q" is minimized.

SUMMARY OF THE INVENTION

The present invention relates to an improved method of adjusting the resonant frequency of a piezoelectric device by laser machining the electrodes in a particular manner such that there is an appropriate change in resonator frequency without a significant change in the "Q" of the filter. More specifically, the present invention discloses a method of laser machining a piezoelectric device such that material is removed from the approximate geometric center of the electrodes in a single "contiguous area" pattern generated by overlapping holes in both the X and Y directions.

In another aspect of the present invention, the particularized laser beam machining pattern may be effected in a location different from the geometric center of the electrodes so as to simultaneously adjust the frequency and bandwidth of an acoustically-coupled monolithic crystal filter. Moving the laser trimmed areas toward the inter-resonator gap has the effect of decreasing the acoustic coupling, while moving the laser trimmed areas away from the inter-resonator gap has the effect of increasing the acoustic coupling, thereby demonstrating that the monolithic crystal filter bandwidth can be either increased or decreased during the laser trimming operation.

In still another aspect of the present invention, wherein a two-pole acoustically-coupled monolithic crystal filter includes a singular common ground electrode, the particularized laser beam machining pattern may first be effected on only one electrode pair so as to adjust the resonator frequency difference, followed by a conventional vapor deposition process on the common ground electrode to adjust the filter center frequency. If only the higher frequency resonator is laser trimmed, the frequency difference will be increased, whereas if only the lower frequency resonator is laser trimmed, the frequency difference will be decreased, thereby demonstrating that the resonator frequency difference of a two-pole monolithic crystal filter may be controlled by the laser trimming operation.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings, in the several figures of which like referenced numerals identify like elements, and in which:

FIG. 2b is a cross-sectional view taken generally across the line 2b—2b of FIG. 2a;

FIG. 4a is an enlarged representation of the laser machined area of FIG. 1 in accordance with the present invention;

FIG. 4b is an alternate embodiment of the present invention illustrating another enlarged representation of the laser machined area of FIG. 1.

FIGS. 5a, 5b and 5c are partial planar views of the monolithic crystal filter wafer of FIG. 1 showing three variations of the positions of the laser machined areas with respect to the inter-resonator gap;

FIG. 7b is a cross-sectional view taken generally across the line 7b—7b of FIG. 7a.

DETAILED DESCRIPTION OF THE INVENTION

Figure 1:
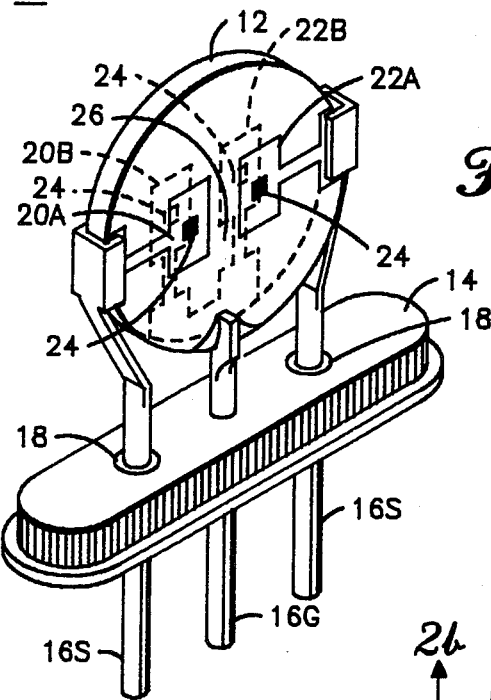
FIG. 1 is a greatly-enlarged perspective view of one form of a two-pole monolithic crystal filter illustrating the location of the electrode area removed in accordance with the present invention.

FIG. 1 shows one form of a two-pole monolithic crystal filter 10 which is illustrative of the location of the electrode area removed in accordance with the method of this invention. The AT-cut quartz crystal wafer 12 is securely attached to the metal header 14 by means of a plurality of support leads 16 which extend through apertures in the metal header 14. At least one of the support leads 16G is used for a ground terminal and is electrically connected to the metal header 14; the other support leads 16S which are electrically active are insulated from the metal header by means of a glass insulating material 18. The quartz crystal wafer 12 has a plurality of electrodes 20A, 20B, 22A, 22B of a suitable contact metal, such as gold, vapor deposited or otherwise plated on opposite sides of wafer 12 in a superimposed relationship to create piezoelectric resonators 20 and 22 separated by an inter-resonator gap 26. Each resonator 20, 22 is initially designed to have a resonant frequency slightly below the desired nominal value such that the desired resonant frequency may be achieved by laser machining material from the electrodes. The present invention teaches that the laser machined area 24 on the surface of each electrode 20A, 20B, 22A, 22B, be positioned in the geometric center of said electrodes in a particular pattern which will subsequently be fully described.

The laser machining apparatus for trimming electrodes on quartz crystals is well known in the art; and, accordingly, a complete description of the apparatus is not deemed necessary. It is to be noted, however, that the laser beam wavelength is such that the quartz crystal is transparent to the beam. Therefore, the electrode material on both surfaces of the quartz wafer 12 will be vaporized nearly simultaneously by the laser beam with only one laser machining operation performed on only one surface of the wafer.

Figure 2A:
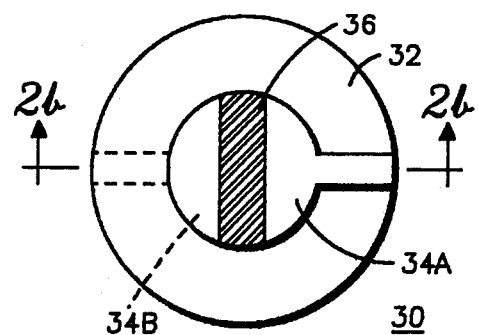
FIG. 2a is a planar view of a single resonator quartz wafer illustrating the location of the electrode area removed in accordance with the prior art.
Figure 2B:
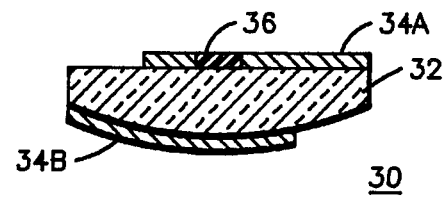

FIG. 2 illustrates the location of the electrode area removed in accordance with that known in the prior art. FIG. 2a is a planar view, and FIG. 2b is a cross-sectional view of a single resonator crystal 30 comprising a quartz crystal wafer 32 and electrodes 34A, 34B, vapor deposited on both sides of water 32. The shaded area 36 across the surface of only the front electrode 34A represents the region in which the laser machining was performed.

Figure 3:
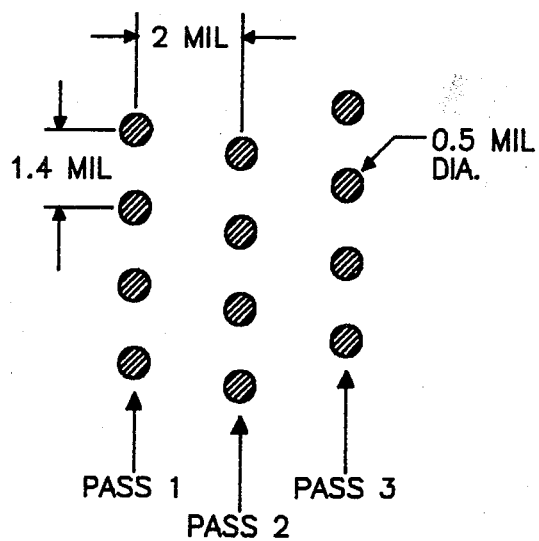
FIG. 3 is an enlarged representation of the laser machined area of FIG. 2 in accordance with the prior art.

FIG. 3 is an enlarged diagram of the laser machined region 36 of FIG. 2 in accordance with the prior art. This regularly-spaced array of separate holes or "spot pattern" was generated by laser machining a row of 0.5 mil diameter holes separated by 1.4 mils in each pass and then re-indexing at the end of each pass by 2 mils and repeating this row to achieve the larger region 36. Each time the laser beam strikes the electrode, a spot of electrode material is vaporized; thus reducing the mass of the electrode, thereby raising the frequency of the piezoelectric device. However, electrode material at the circumference of the spot just removed has been adversely affected by partial melting to form particles or tiny beads of mass which remain loosely attached to the surface. If a large change in resonator frequency is desired such as on the order of kilohertz, this "spot pattern" technique creates a large accumulation of loose particles which significantly affect the electrical parameters of the piezoelectric device as observed by a substantial degradation of the "Q" of the resonator. It is for this reason that the prior art "spot pattern" technique was limited to extremely-fine frequency adjustments.

FIG. 4a is an enlarged diagram of the laser machined area 24 of FIG. 1 in accordance with the present invention. The specific pattern generated by the laser beam machining process is a single small "contiguous area" produced by partially-overlapping holes in both the X and Y directions to remove the maximum amount of electrode material within a given perimeter of electrode surface area. This "contiguous area" pattern may be generated by following the "outwardly-spiraling square" path shown in FIG. 4a and described here: (a) the laser beam is positioned at the approximate geometric center of the electrode and the first hole of approximately 1 mil in diameter is machined; (b) The beam is moved approximately one-half the diameter of the hole produced or approximately 0.5 mil in the +Y direction, and another hole is machined which partially overlaps the first hole; (c) the beam is moved the same "step" of approximately 0.5 mil in the −X direction, and another hole is machined which partially overlaps the previous two holes; (d) the beam is moved the same step in the −Y direction, and another hole is machined which partially overlaps the previous three holes; (e) the beam is moved the same step again in the −Y direction, and another hole is machined; (f through p) the same outwardly-spiraling path illustrated in FIG. 4a is followed to produce the desired "contiguous area" pattern of electrode material removed.

FIG. 4b is a modified version of the "outwardly-spiraling square" path of FIG. 4a demonstrating another embodiment of the present invention. The same "contiguous area" pattern of laser machining may alternately be generated by following the path shown in FIG. 4b, wherein the laser beam is moved in 0.707 mil "steps" to achieve the desired pattern of partially-overlapping holes in both the X and Y directions. As illustrated, the 0.707 mil "step" is the maximum distance between center points of the laser machined holes that will remove all the electrode material within the total outer perimeter of the laser machined area. Thus, it becomes obvious that any increment may be used to position the laser beam, provided that the increment is less than or equal to 0.707 times the diameter of the hole produced. Additionally, FIG. 4b shows that either a clockwise or counter-clockwise spiral, initiated in any direction from the first laser machined hole, may be followed to produce the same "outwardly-spiralling square" path.

In the present embodiments, the "outwardly-spiraling square" path was used to generate the "contiguous area" of material removed, but it should be understood that other configurations such as circular, rectangular, zigzag, or index-and-repeat, may be used to achieve the same result. It should also be understood that the crystal wafer may be moved with respect to the laser beam to achieve the same "contiguous area" pattern. The enlarged diagrams of FIG. 4 show a "contiguous area" of electrode material removal comprising of only sixteen individual laser machining steps, but it should be obvious that the actual number of individual steps is determined by the desired change in frequency of the particular device.

The "contiguous area" technique of the present invention has an inherent advantage over the "spot pattern" technique of the prior art in that the detrimental effects of the laser beam to the electrode material are significantly reduced. Since a singular "contiguous area" is removed, the laser can only affect the adhesion property of the remaining electrode material immediately surrounding the area removed; for example, in FIG. 4, the approximate perimeter of the square will be affected. If the same amount of electrode mass were to be removed by the "spot pattern" technique, the area affected would approximately be the total of the circumferences of all the spots. Even though less "spot pattern" holes are required to remove the same amount of mass, hundreds of holes are required to change the frequency of the piezoelectric resonator by kilohertz. Therefore, the "spot pattern" technique of laser beam machining has affected the adhesion properties of a large portion of the electrode surface, creating a significant accumulation of loose particles which degrade the "Q" of the device. In contrast, the "contiguous area" technique of the present invention minimizes the electrode surface area exposed to the laser beam reducing the extent of accumulation of loose particles, thus optimizing the monolithic crystal filter by minimizing the "Q" degradation while maximizing the change in frequency of the device.

Figure 6:
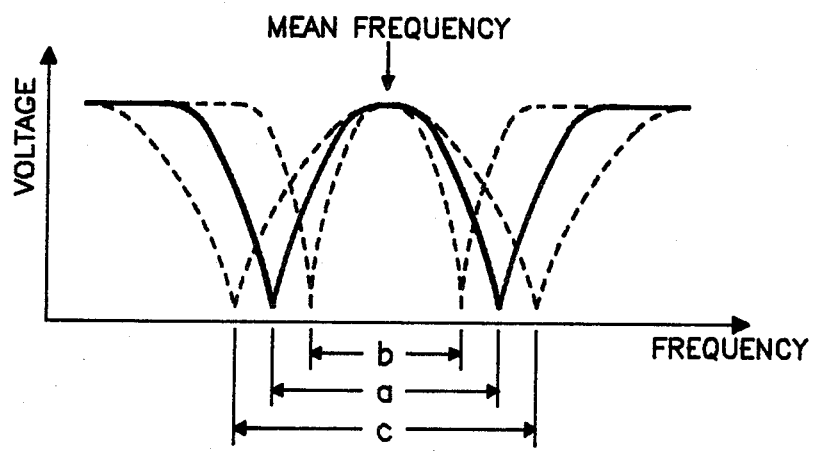
FIG. 6 is a graphic representation of voltage vs. frequency (obtained by the short-circuit method) of the two-pole monolithic crystal filter, showing the relationship of the short-circuit bandwidth to the position of the laser machined area of FIG. 5.

FIGS. 5a, 5b and 5c are partial planar views of the monolithic crystal filter wafer of FIG. 1 showing the laser machined area 24 and the inter-resonator gap 26. The first aspect of the present invention teaches the technique of laser machining a single "contiguous area" into the approximate geometric center of the electrode as shown in FIG. 5a. When this is performed on a monolithic crystal filter, the center frequency of the filter is maximally changed, whereas the inter-resonator coupling is minimally affected. FIG. 6 represents the voltage vs. frequency characteristic of the two-pole monolithic crystal filter of FIG. 5, obtained by the standard short-circuit method of measuring the coupling on a two-pole monolithic crystal filter device. FIG. 6a shows the nominal short-circuit bandwidth of the monolithic crystal filter that has been laser trimmed in accordance with FIG. 5a.

Another aspect of the present invention is disclosed when the laser beam is directed to shift the laser machined areas 24 along the X axis toward or away from the inter-resonator gap 26, thereby simultaneously controlling the bandwidth, as well as the center frequency, of the monolithic crystal filter. FIG. 5b shows the laser machined areas 24 moved closer together toward the inter-resonator gap 26, and FIG. 6b represents the corresponding short-circuit bandwidth. Note in FIG. 6b that the short-circuit bandwidth has become narrowed due to the shift of the laser machined areas 24 toward the inter-resonator gap 26, yet the same mean frequency has been achieved by removing the same amount of mass from each electrode. FIG. 5c shows the opposite effect when moving the laser machined areas 24 away from the inter-resonator gap 26 to obtain the widened short-circuit bandwidth illustrated in FIG. 6c. Accordingly, the present invention discloses a method of laser trimming the monolithic crystal filter to frequency, while simultaneously controlling the bandwidth in increasing or decreasing increments by shifting the location of the laser machined areas.

Figure 7A:
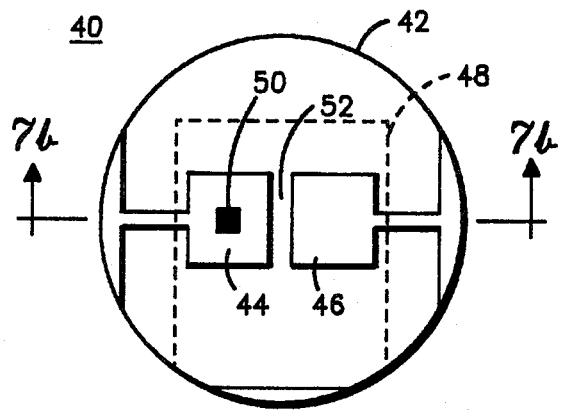
FIG. 7a is a partial planar view of a two-pole single-phase monolithic crystal filter wafer showing the location of the laser machined area.
Figure 7B:
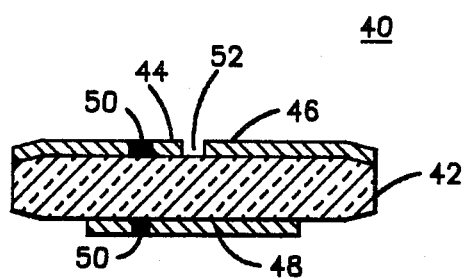

FIG. 7 illustrates an alternate method to adjust a single-phase monolithic crystal filter to frequency using the combination of the laser trimming technique of the present invention and the known process of vapor deposition. A single-phase monolithic crystal filter, as illustrated in FIG. 7, includes a singular common ground electrode on one surface of the crystal wafer that covers the inter-resonator coupling area. FIG. 7a is a partial planar view of a single-phase monolithic crystal filter wafer, and FIG. 7b is a cross-sectional view taken generally across the line 7b—7b of FIG. 7a. The single-phase monolithic crystal filter 40 consists of a quartz crystal wafer 42 with electrodes 44, 46 attached on the front side of wafer 42 separated by the inter-resonator gap 52 with the single-phase electrode 48 attached on the reverse side of wafer 42. In this example, the laser machined area 50 is shown to be located in the geometric center of only one electrode 44 (on the front side)

which extends through the associated single-phase electrode 48 (on the reverse side) in the manner shown.

The left-most resonator, comprised of electrodes 44, 48, is intended to operate at a frequency $f_1$, whereas the right-most resonator, comprised of electrodes 46, 48, is intended to operate at a frequency $f_2$. As is known in the art, it is often a requirement for the difference of the two resonator frequencies $f_1-f_2$ to meet a specific predetermined design criteria in addition to the monolithic crystal filter center frequency specification. In some applications, it may be necessary that $f_1-f_2$ be accurately controlled to take into account the effects of the external components of the circuit. Accordingly, this aspect of the present invention provides an effective process to control the resonator frequency difference of the monolithic crystal filter by laser trimming only one resonator to achieve the desired $f_1-f_2$, and then adjusting the center frequency of the filter by vapor deposition.

In the first step of the process, a single-phase monolithic crystal filter is manufactured in accordance with known techniques to obtain a center frequency slightly higher than the desired nominal value. The second step of the process comprises the laser trimming of the "contiguous area" pattern into the geometric center of only one electrode on the front side (and extending through the single-phase electrode on the reverse side) to raise the frequency of that resonator to obtain the desired resonator frequency difference $f_1-f_2$. If the high frequency resonator is laser trimmed, that individual resonator frequency will increase, resulting in an increase in the resonator frequency difference $f_1-f_2$; whereas, if the low frequency resonator is laser trimmed, that individual resonator frequency will increase, resulting in a decrease of the resonator frequency difference $f_1-f_2$. The third step involves adding mass by the known process of vapor deposition to the common single-phase electrode to lower the frequency of both resonators equally to obtain the desired filter center frequency value while the resonator frequency difference $f_1-f_2$ remains unchanged. Since the mass is deposited to only the common single-phase electrode, the critical masking of each individual electrode is eliminated. Therefore a significant reduction in close-tolerance, time-consuming masking steps has been demonstrated.

In summary, a method has been disclosed for controlling both frequency and bandwidth of monolithic crystal filters by laser trimming a single "contiguous area" into the center of the electrodes to adjust frequency, and by shifting the location of the laser trimmed area to adjust the bandwidth. The "contiguous area" laser trimming technique of the present invention provides a novel means to maximally adjust the frequency while minimally degrading the "Q" of the crystal filter, resulting in improved manufacturing productivity.

While only particular embodiments of the invention have been shown and described herein, it will be obvious that certain modifications may be made without departing from the invention in its broader aspects, and accordingly, the appended claims are intended to cover all such changes and alternative variations that fall within the true scope and spirit of the invention.

What is claimed is:

1. An improved method of adjusting the resonant frequency of a piezoelectric device having a plurality of electrodes positioned on opposing surfaces of a crystal wafer to form at least one piezoelectric resonator, including the steps of:

laser machining the electrode material from the respective resonator electrode to adjust the frequency of said resonator to a desired value, said laser machining being effected in the approximate geometric center of said electrode in a single contiguous area manner, whereby the Q of said piezoelectric device is minimally affected by said laser machining.

2. The method as described in claim 1, wherein said single contiguous area manner of laser machining is generated by an outwardly spiralling path of partially overlapping holes.

3. The method as described in claim 2, wherein said lasered holes are partially overlapping in both the X and Y directions.

4. The method as described in claim 3, wherein said lasered holes are approximately one mil in diameter.

5. The method as described in claim 1, wherein said laser machining removes electrode material from both electrodes positioned on opposing sides of said crystal wafer substantially simultaneously with a single laser machining operation.

6. The method as described in claim 1, wherein said piezeoelectric device crystal wafer is comprised of AT-cut quartz.

7. The method as described in claim 1, wherein said piezeoelectric device is a monolithic crystal filter.

8. An improved method of adjusting the resonant frequency of a monolithic crystal filter device having a plurality of electrodes positioned on opposing surfaces of a crystal wafer to form at least two acoustically-coupled piezoelectric resonators, including the steps of:

laser machining the electrode material from the respective resonator electrode to adjust the frequency of said resonator to a desired value, said laser machining being effected in a single contiguous area manner but at a location shifted from the geometric center of said electrode so as to alter the inter-resonator coupling between said resonators, whereby the Q of said monolithic crystal filter device is minimally affected by said laser machining.

9. The method as described in claim 8, wherein said laser machining being effected at a location shifted toward the inter-resonator gap to narrow the bandwidth of said monolithic crystal filter.

10. The method as described in claim 8, wherein said laser machining being affected at a location shifted away from the inter-resonator gap to widen the bandwidth of said monolithic crystal filter.

11. The method as described in claim 8, wherein said single contiguous area manner of laser machining is generated by an outwardly spiralling path of partially overlapping holes.

12. The method as described in claim 11, wherein said lasered holes are partially overlapping in both the X and Y directions.

13. The method as described in claim 12, wherein said lasered holes are approximately one mil in diameter.

14. The method as described in claim 8, wherein said laser machining removes electrode material from both electrodes positioned on opposing sides of said crystal wafer substantially simultaneously with a single laser machining operation.

15. The method as described in claim 8, wherein said monolithic crystal filter device wafer is comprised of AT-cut quartz.

16. An improved method of adjusting the frequency difference between a predetermined pair of acoustically-coupled resonators of a monolithic crystal filter device having a singular common ground electrode covering the inter-resonator coupling area on one surface of a crystal wafer and individual electrodes on the opposing surface, including the steps of:
    laser machining the electrode material from the respective resonator electrode to adjust the frequency of said resonator to a desired value,
    subsequently vapor depositing material onto said singular common ground electrode to adjust the center frequency of said monolithic crystal filter device,
    said laser machining being effected in the approximate geometric center of said individual electrode in a single contiguous area manner, whereby the Q of said monolithic crystal filter device is minimally affected by said laser machining.

17. The method as described in claim 16, wherein said laser machining being effected upon the lower frequency resonator electrode of said predetermined resonator pair to decrease the frequency difference between said resonator pair.

18. The method as described in claim 16, wherein said laser machining being effected upon the higher frequency resonator electrode of said predetermined resonator pair to increase the frequency difference between said resonator pair.

19. The method as described in claim 16, wherein said single contiguous area manner of laser machining is generated by an outwardly spiralling path of partially overlapping holes.

20. The method as described in claim 19, wherein said lasered holes are partially overlapping in both the X and Y directions.

21. The method as described in claim 20, wherein said lasered holes are approximately one mil in diameter.

22. The method as described in claim 16, wherein said laser machining removes electrode material from both electrodes positioned on opposing sides of said crystal wafer substantially simultaneously with a single laser machining operation.

23. The method as described in claim 16, wherein said monolithic crystal filter device wafer is comprised of AT-cut quartz.

24. A piezoelectric device adjusted to a desired frequency having minimally affected Q, comprising:
    a piezoelectric crystal wafer having two opposing major surfaces,
    at least two electrodes, each of which is positioned on opposing surfaces in an overlying relationship to form at least one piezoelectric resonator,
    at least one electrode having a single contiguous area in the approximate geometric center of said electrode, said contiguous area comprised of a plurality of partially-overlapping laser-machined holes, whereby the Q of said piezoelectric device is minimally affected by said laser machining.

25. A piezoelectric device as described in claim 24, wherein said contiguous area has the maximum amount of electrode material removed from within the perimeter of said area.

26. A piezoelectric device as described in claim 24, wherein said laser-machined holes are partially overlapping in both the X and Y directions.

27. A piezoelectric device as described in claim 24, wherein said laser-machined holes are approximately one mil in diameter.

28. A piezoelectric device as described in claim 24, wherein both electrodes positioned on opposing sides of said crystal wafer each have said single contiguous area of approximately the same dimensions in approximately the same location on each electrode.

29. A piezoelectric device as described in claim 24, wherein said piezeoelectric device crystal wafer is comprised of AT-cut quartz.

30. A piezoelectric device as described in claim 24, wherein said piezeoelectric device is a monolithic crystal filter.

31. A monolithic crystal filter device adjusted to a desired frequency having minimally affected Q, comprising:
    a piezoelectric crystal wafer having two opposing major surfaces,
    a plurality of electrodes, each positioned on said opposing surfaces in an overlying relationship to form at least two acoustically-coupled piezoelectric resonators,
    at least one electrode having a single contiguous area at a location shifted from the geometric center of said electrode, said contiguous area comprised of a plurality of partially-overlapping laser-machined holes, whereby the inter-resonator coupling between said resonators has been altered by said laser machining.

32. A monolithic crystal filter device as described in claim 31, wherein said contiguous areas are positioned at a location shifted toward the inter-resonator gap so as to narrow the bandwidth of said monolithic crystal filter.

33. A monolithic crystal filter device as described in claim 31, wherein said contiguous areas are positioned at a location shifted away from inter-resonator gap so as to widen the bandwidth of said monolithic crystal filter.

34. A monolithic crystal filter device as described in claim 31, wherein said contiguous area has the maximum amount of electrode material removed from within the perimeter of said area.

35. A monolithic crystal filter device as described in claim 31, wherein said laser-machined holes are partially overlapping in both the X and Y directions.

36. A monolithic crystal filter device as described in claim 31, wherein said laser-machined holes are approximately one mil in diameter.

37. A monolithic crystal filter device as described in claim 31, wherein both electrodes positioned on opposing sides of said crystal wafer each have said single contiguous area of approximately the same dimensions in approximately the same location on each electrode.

38. A monolithic crystal filter device as described in claim 31, wherein said monolithic crystal filter device wafer is comprised of AT-cut quartz.

39. A monolithic crystal filter device adjusted to a desired frequency having minimally affected Q, comprising:
    a piezoelectric crystal wafer having two opposing major surfaces,
    a singular common ground electrode covering the inter-resonator coupling area on one surface of said crystal wafer,
    at least two individual electrodes, both positioned on the opposing surface of said wafer in an overlying relationship to said common ground electrode to form a pair of acoustically-coupled piezoelectric resonators, at least one individual electrode having a single contiguous area in the approximate geometric center of said individual electrode, said contiguous area comprised of a plurality of partially-overlapping laser-machined holes, and an additional layer of electrode material vapor-deposited onto said singular common ground electrode, whereby the frequency difference between said resonator pairs has been altered by said laser machining.

40. A monolithic crystal filter device as described in claim 39, wherein said individual electrode having said contiguous area is part of the lower frequency resonator of a predetermined resonator pair, whereby the frequency difference between said resonator pair has been decreased by said laser machining.

41. A monolithic crystal filter device as described in claim 39, wherein said individual electrode having said contiguous area is part of the higher frequency resonator of a predetermined resonator pair, whereby the frequency difference between said resonator pair has been increased by said laser machining.

42. A monolithic crystal filter device as described in claim 39, wherein said contiguous area has the maximum amount of electrode material removed from within the perimeter of said area.

43. A monolithic crystal filter device as described in claim 39, wherein said laser-machined holes are partially overlapping in both the X and Y directions.

44. A monolithic crystal filter device as described in claim 39, wherein said laser-machined holes are approximately one mil in diameter.

45. A monolithic crystal filter device as described in claim 39, wherein both electrodes positioned on opposing sides of said crystal wafer each have said single contiguous area of approximately the same dimensions in approximately the same location on each electrode.

46. A monolithic crystal filter device as described in claim 39, wherein said monolithic crystal filter device wafer is comprised of AT-cut quartz.

47. The method as described in claim 1, wherein the frequency of said resonator is adjusted on the order of kilohertz.

48. The method as described in claim 8, wherein the frequency of said resonator is adjusted on the order of kilohertz.

49. The method as described in claim 16, wherein the frequency of said resonator is adjusted on the order of kilohertz.

50. A piezoelectric device as described in claim 24, wherein said single contiguous area is dimensioned such that the frequency of said device is changed on the order of kilohertz.

51. A monolithic crystal filter device as described in claim 31, wherein said single contiguous area is dimensioned such that the frequency of said device is changed on the order of kilohertz.

52. A monolithic crystal filter device as described in claim 39, wherein said single contiguous area is dimensioned such that the frequency of at least one of said resonator pairs is changed on the order of kilohertz.

* * * * *